United States Patent
Shveykin et al.

(10) Patent No.: US 8,238,398 B2
(45) Date of Patent: Aug. 7, 2012

(54) DIODE LASER, INTEGRAL DIODE LASER, AND AN INTEGRAL SEMICONDUCTOR OPTICAL AMPLIFIER

(75) Inventors: Vasiliy Ivanovich Shveykin, Moscow (RU); Viktor Archilovich Gelovani, Moscow (RU); Aleksey Nikolaevich Sonk, Moscow (RU); Igor Petrovich Yarema, Dolgoprudny (RU)

(73) Assignee: General Nano Optics Limited, Nicosia (CY)

( * ) Notice: Subject to any disclaimer, the term of this patent is extended or adjusted under 35 U.S.C. 154(b) by 66 days.

(21) Appl. No.: 12/996,165

(22) PCT Filed: Jun. 3, 2009

(86) PCT No.: PCT/RU2009/000278
§ 371 (c)(1),
(2), (4) Date: Dec. 3, 2010

(87) PCT Pub. No.: WO2009/148360
PCT Pub. Date: Dec. 10, 2009

(65) Prior Publication Data
US 2011/0150021 A1      Jun. 23, 2011

(30) Foreign Application Priority Data

Jun. 6, 2008   (RU) .............................. 2008122549

(51) Int. Cl.
*H01S 5/00* (2006.01)
(52) U.S. Cl. ............... 372/49.01; 372/50.12; 372/50.21; 372/46.01; 372/45.01
(58) Field of Classification Search ............... 372/49.01, 372/50.12, 50.21, 46.01, 45.01
See application file for complete search history.

(56) References Cited

U.S. PATENT DOCUMENTS 4,063,189 A    12/1977  Scifres et al.
(Continued)

FOREIGN PATENT DOCUMENTS

| | | |
|---|---|---|
| EP | 1 906 499 A1 | 4/2008 |
| JP | 10093197 A | 4/1998 |
| RU | 2 109 381 C1 | 4/1998 |
| RU | 2 134 007 C1 | 7/1999 |

(Continued)

OTHER PUBLICATIONS

International Search Report for International Application No. PCT/RU2009/000278 dated Oct. 1, 2009.

*Primary Examiner* — Kinam Park
(74) *Attorney, Agent, or Firm* — Haynes and Boone, LLP; Pavel I. Pogodin

(57) ABSTRACT

Invention relates to three types of laser light sources: diode laser, integral diode laser (in form of integrally connected diode lasers) and integral semiconductor optical amplifier (in form of integrally connected driving laser diode and semiconductor amplifier element), which amplifier consists of original optical resonator of diode laser and original laser radiation coupling. Two reflectors in optical resonator of diode laser, which falls into three types of above-mentioned laser radiation sources, have greatest possible reflection factor on both sides thereof and radiation coupling from active layer is carried out, by-passing active layer, through broadband semiconductor layers of the modified heterostructure of diode laser with practically fully antireflective (less than 0.01%) optical face. Invention makes it possible to design superpower, high-performance, high-speed and reliable three types of sources of single-frequency, single-mode and multimode high quality laser radiation in broad wavelength band, to simplify the production and cut in production costs thereof.

16 Claims, 3 Drawing Sheets

U.S. PATENT DOCUMENTS

| | | | |
|---|---|---|---|
| 5,862,168 A * | 1/1999 | Schilling et al. | 372/50.1 |
| 7,839,909 B2 * | 11/2010 | Shveykin | 372/44.01 |
| 2008/0123710 A1 * | 5/2008 | Brick et al. | 372/50.1 |
| 2009/0147812 A1 * | 6/2009 | Shveykin | 372/44.01 |

FOREIGN PATENT DOCUMENTS

| | | |
|---|---|---|
| RU | 2 197 048 C1 | 1/2003 |
| RU | 2 278 455 C1 | 6/2006 |

* cited by examiner

DIODE LASER, INTEGRAL DIODE LASER, AND AN INTEGRAL SEMICONDUCTOR OPTICAL AMPLIFIER

FIELD OF THE INVENTION

The invention relates to key components of optoelectronic engineering—compact, efficient and high-power laser sources of a wide wavelength range with high quality of emission, namely: to a diode (semiconductor, injection) laser, to diode lasers integrally connected along the axis (hereinafter referred to as the integrated diode laser) as well as to a master diode laser and a semiconductor amplifying element integrally connected along the axis (hereinafter referred to as the integrated semiconductor optical amplifier).

DESCRIPTION OF THE RELATED ART

Diode lasers of increased output power and improved laser beam quality are known from the following inventions: [U.S. Pat. No. 4,063,189, XEROX CORP. (US), 1977, H01S 3/19, 331/94.5 H], [RU Patent 2197048, V. I. SHVEIKIN, V. A. GELOVANI, 18 Feb. 2002, H01 S 5/32].

From the standpoint of the technical essence and the technical result being obtained, an exemplary prototype injection (hereinafter diode) laser is proposed in [RU Patent 2278455, V. I. SHVEIKIN, 17 Nov. 2004, H01S 5/32]. Said diode laser includes a heterostructure based on semiconductor compounds, optical facets, reflectors, ohmic contacts, an optical resonator. The heterostructure is characterized by the ratio of the effective refractive index $n_{eff}$ of the heterostructure to the refractive index $n_{IN}$ of the leak-in layer, namely, the ratio of $n_{eff}$ to $n_{IN}$ is determined from the range from one plus delta to one minus delta, where delta is determined by a number much lesser than one.

The heterostructure contains at least one active layer, at least two reflective layers, at least one on each side of the active layer. Said reflective layers are formed at least of one sublayer and have refractive indices lesser than the effective refractive index $n_{eff}$ of the heterostructure. The heterostructure contains also an emission leak-in region. Said leak-in region is transparent for emission. The leak-in region is at least one and is located between the active layer and a corresponding reflective layer, at least on one side of the active layer. The leak-in region includes an emission leak-in layer having a refractive index $n_{IN}$ and consisting at least of one sublayer. The leak-in region includes also at least one confining layer consisting at least of one sublayer. The leak-in region includes also a main adjusting layer consisting at least of one sublayer, having at least for one of its sublayers a refractive index no less than the refractive index $n_{IN}$ of the leak-in layer, and adjacent with one its surface to the active layer. On the opposite side of the main adjusting layer to another its surface a confining layer of the leak-in region is adjacent; said confining layer has a refractive index lesser than the refractive index of the main adjusting layer. The reflection coefficients of the optical resonator reflectors as well as the compositions and thicknesses of the heterostructure layers are chosen such that for the operating diode laser the resulting amplification of emission in the active layer is sufficient to maintain a lasing threshold throughout the range of operating currents. The ratio $n_{eff}/n_{IN}$ in the field of lasing threshold currents is determined from the range of values from one plus gamma to one minus gamma, where the value of gamma is determined by a number lesser than delta. In the construction of the injection laser considered in the example corresponding to FIG. 5 (see [RU Patent 2278455, V. I. SHVEIKIN, 17 Nov. 2004, H01S 5/32]) the active region with current flowing in operation of the diode laser is made as a mesa stripe.

The main advantages of the prototype diode laser are the augmentation of laser output power, the increase of the size of the emitting area in the vertical plane with corresponding reduction of angular divergence of emission. At the same time the prototype diode laser limits further augmentation of output power with simultaneous and significant improvement of laser emission quality.

In addition, the known prototype diode laser does not allow the realization of diode lasers integrally connected along the axis, namely, an integrated diode laser (hereinafter referred to as the IDL) and a master diode laser (hereinafter referred to as the MDL) with a semiconductor amplifying element (hereinafter referred to as the SAE) integrally connected along the axis, namely, an integrated semiconductor optical amplifier (hereinafter referred to as the ISOA).

The integrated semiconductor optical amplifier of increased output power and improved laser beam quality is known from the following inventions: [RU Patent 2109381 (application 96115454), V. I. SHVEIKIN, "POLYUS" RDI SE RU, 19 Aug. 1996, H01S 3/19, "Integrated semiconductor laser-amplifier"], [RU Patent 2134007, V. I. SHVEIKIN, "POLYUS" RDI SE RU, 12 Mar. 1998, H01 S3/19].

From the standpoint of the technical essence, an exemplary integrated semiconductor optical amplifier is proposed in [RU Patent 2134007, V. I. SHVEIKIN, "POLYUS" RDI SE RU, 12 Mar. 1998, H01 S 3/19]. Said integrated semiconductor optical amplifier includes a master diode laser (hereinafter referred to as the MDL) and a semiconductor amplifying element (hereinafter referred to as the SAE) integrally connected, placed along the same axis and made of the same semiconductor heterostructure. Said heterostructure contains at least one active layer, at least two confining layers (heretofore two reflective layers), an input-output region transparent for emission, and optical facets, ohmic contacts. Besides, the MDL includes an active region with current flowing in operation of the MDL, emission confinement regions from the lateral sides of said active region, an optical resonator and its reflectors. The SAE includes at least one amplification region with current flowing in operation of the SAE with an antireflection coating on the output optical facet.

In the operating amplifier a corresponding angle of incident δ for amplified emission leaking from the active layer is chosen, the effective refractive index $n_{eff}$ of the heterostructure together with the input-output region transparent for emission and the refractive index $n_{IOR}$ of said input-output region conforming to the relation $0<\arccos n_{eff}/n_{IOR} \leq n_{effmin}/n_{IOR}$ for $n_{IOR}$ more than $n_{min}$, where $n_{effmin}$ is the minimum value of $n_{eff}$ of all possible $n_{eff}$ for a multitude of heterostructures of practical value together with the input-output region, and $n_{min}$ is the least of the refractive indices of semiconductor compounds making the heterostructure.

The main advantage of the prototype ISOA is the originality of the proposed designs of the integrally connected ISOA of increased output power, increased sizes of the emitting area, and corresponding reduction of angular divergence of emission. The main disadvantage of the proposed designs is the complexity of their technological realization.

SUMMARY OF THE INVENTION

The main technical result is that an original diode laser with a nontransmitting optical resonator (NOR-DL) is proposed that caused a real possibility to produce efficient laser sources in the integrated form, namely, two and more diode lasers integrally connected along the axis hereinafter referred to as the integrated DL (IDL) and a master diode laser with a semiconductor amplifying element integrally connected along the axis hereinafter referred to as the integrated semiconductor optical amplifier (ISOA).

The technical result of the proposed NOR-DL is the significant decrease (two and more times) of lasing threshold current density, the increase of efficiency and power of laser emission, the improvement of stability of mode generation, the sharp (an order of magnitude and more) increase of strength of the nontransmitting reflectors of the optical resonator, the realization of laser emission output, omitting the active layer through semiconductor wide-band layers (relative to the active layer) with an antireflection optical facet, the creation of optimum lateral confinement regions, which made it possible to develop for a wide range of wavelengths high-power, high-efficiency and reliable, with increased life time, sources of single-frequency, single-mode and multimode laser emission with high-speed modulation of laser emission, with significant simplification of technology for their manufacturing and cut in the production costs.

The technical result of the proposed IDL is the significant decrease (two and more times) of lasing threshold current density, the increase of efficiency and power of laser emission, the improvement of stability of mode generation, the sharp (an order of magnitude and more) increase of strength of the nontransmitting reflectors of the optical resonator, the realization of laser emission output, omitting the active layer through semiconductor wide-band layers (relative to the active layer) with an antireflection optical facet, the creation of optimum lateral confinement regions, which made it possible to develop for a wide range of wavelengths high-power, high-efficiency and reliable, with increased life time, sources of single-frequency, single-mode and multimode laser emission with high-speed modulation of laser emission, with significant simplification of technology for their manufacturing and cut in the production costs.

The technical result of the proposed ISOA is the significant decrease (two and more times) of lasing threshold current density, the increase of efficiency and power of laser emission, the improvement of stability of mode generation, the sharp (an order of magnitude and more) increase of strength of the nontransmitting reflectors of the optical resonator, the realization of laser emission output, omitting the active layer through semiconductor wide-band layers (relative to the active layer) with an antireflection optical facet, the creation of optimum lateral confinement regions, which made it possible to develop for a wide range of wavelengths high-power, high-efficiency and reliable, with increased life time, sources of single-frequency, single-mode and multimode laser emission with high-speed modulation of laser emission, with significant simplification of technology for their manufacturing and cut in the production costs.

One aspect of the present invention is a diode laser including a heterostructure based on semiconductor compounds. Said heterostructure contains at least one active layer, at least two confining layers, an emission leak-in region, said leak-in region being transparent for emission, containing at least a leak-in layer; said leak-in region is placed between the active layer and a corresponding confining layer, at least on one side of the active layer. Said diode laser includes also an active region with current flowing in operation of the diode laser, optical facets, reflectors, an optical resonator, an ohmic contact. Said heterostructure is additionally characterized by the ratio of the effective refractive index $n_{eff}$ of the heterostructure to the refractive index $n_{IN}$ of the leak-in layer, namely, the ratio of $n_{eff}$ to $n_{IN}$ is determined from the range from one plus delta to one minus gamma, where delta and gamma are determined by a number much lesser than one and gamma is more than delta. Besides, there are emission confinement regions that are located at a predetermined distance from both lateral sides of the active region with flowing current and penetrate from the external layer into the heterostructure at least to the active layer and further deep into the heterostructure. On the side of emission output on an optical facet there is an antireflection coating with a laser emission reflection coefficient near zero, and on the same side of emission output an optical resonator reflector with a laser emission reflection coefficient near one is formed, said reflector being adjacent to the active layer and to semiconductor layers of the heterostructure located on both sides of the active layer, the total thickness of said semiconductor layers is at least in the range from $(\lambda/4n_{eff})$ μm to $(4\lambda/n_{eff})$ μm, где $\lambda$ is the free-space laser wavelength.

The essential distinction of the new proposed NOR-DL consists in an original and unusual proposed combination of a unobvious optical resonator and unobvious output of laser emission. The attainment of a lasing threshold is carried out in an optical resonator including on both sides reflectors with a maximum high reflection coefficient for both high-strength mirrors (nontransmitting optical resonator). The output of emission from the active layer is carried out through the wide-band (relative to the energy gap width in the active layer) leak-in region of a modified heterostructure of the diode laser with an antireflection (less than 0.01%) optical facet. It is this proposal that has opened up new possibilities to achieve the above technical result and has made it possible to develop both a single-element NOR-DL and the above combinations made in the integrated form: the IDL and the ISOA consisting of the MDL and the SAE.

In the preferred embodiment delta tends to zero.

This determines a choice of a corresponding heterostructure.

In the preferred embodiment said reflector formed on the side of emission output is placed approximately from the external layer of the heterostructure approximately to the leak-in layer of the heterostructure.

In cases when the output of laser emission from the NOR-DL is carried out in one direction, on the opposite side the optical resonator reflector with a laser emission reflection coefficient near one has a height equal to the heterostructure thickness.

In the preferred embodiment an antireflection coating is on an optical facet either throughout the heterostructure thickness or on part of the heterostructure thickness that remained after deposition of a reflective coating.

In the preferred embodiment lateral confinement regions of said active region that are deepened in a predetermined manner have refractive indices less than the effective refractive index $n_{eff}$ of the heterostructure. In this case said confinement regions are placed at a predetermined distance (of micron sizes) from the lateral sides of the active region and at a predetermined depth below the disposition of the active layer of the heterostructure, in extreme cases up to a confining layer of the heterostructure nearest to the substrate. This makes it possible to improve the stability of mode generation and respectively to increase lasing efficiency at increased output powers.

The essence of the unobvious NOR-DL proposed in the present invention consists in the unobvious and efficient construction of an optical resonator and the method of laser emission output outside the optical resonator. The singularity of the optical resonator construction is that both its reflectors practically totally reflect emission emerging from the active layer of the laser. Laser emission output is realized mainly from the leak-in layer of the proposed heterostructure, omitting the nontransmitting reflectors of the optical resonator through the wide-band leak-in region with an antireflection optical facet.

The technological realization of the NOR-DL proposed in the present invention is based on known basic technological processes that are by now well developed and widely used. The proposal meets the criterion "industrial applicability". The main distinction in its manufacturing consists in the features of the heterostructure and the optical resonator of the NOR-DL.

Another aspect of the present invention is an integrated diode laser being a combination of integrally connected diode lasers (hereinafter referred to as the IDL) made of the same heterostructure based on semiconductor compounds. Said heterostructure contains at least one active layer, at least two confining layers, an emission leak-in region, said leak-in region is transparent for emission; said leak-in region contains at least a leak-in layer, is placed at least on one side of the active layer between the active layer and a corresponding confining layer. Said IDL contains at least two optical resonators and at least two active regions with current flowing in operation of the IDL located on the same axis, optical facets, reflectors, and an ohmic contact. Said heterostructure is characterized by the ratio of the effective refractive index $n_{eff}$ of the heterostructure to the refractive index $n_{IN}$ of the leak-in layer, namely, the ratio of $n_{eff}$ to $n_{IN}$ is determined from the range from one plus delta to one minus gamma, where delta and gamma are determined by a number much lesser than one and gamma is more than delta. Besides, on both sides of the active region with flowing current there are emission confinement regions that are located at a predetermined distance from both lateral sides of the active region with flowing current and penetrate from the external layer into the heterostructure at least to the active layer and further deep into the heterostructure. On the side of emission output on an optical facet there is an antireflection coating with a laser emission reflection coefficient near zero, and each optical resonator is confined by reflectors having laser emission reflection coefficients near one and being adjacent to the active layer and to semiconductor layers of the heterostructure located on both sides of the active layer, the total thickness of said semiconductor layers is at least in the range from $(\lambda/4n_{eff})$ μm to $(4\lambda/n_{eff})$ μm, where $\lambda$ is the free-space laser wavelength.

The essential distinction of the new unobvious proposed IDL consists in the new and unobvious connection of two nontransmitting optical resonators and their integral optical connection as well as in highly efficient emission output. A lasing threshold is attained in optical resonators including on both sides reflectors with a maximum high reflection coefficient of both mirrors. The efficient and optimum integral connection of optical resonators (without focusing optics and practically without emission loss) is carried out mainly through the leak-in region of the proposed heterostructure. The output of emission from the IDL is realized through the wide-band leak-in region with a practically fully antireflection (less than 0.01%) optical facet with a deposited antireflection coating. It is this proposal that has opened up new and unobvious possibilities to achieve the above technical result for the IDL.

In cases when the output of laser emission from the IDL is carried out in one direction, on the opposite side the optical resonator reflector with a laser emission reflection coefficient near one has a height equal to the heterostructure thickness.

In the preferred embodiment an antireflection coating is on an optical facet either throughout the heterostructure thickness or on part of the heterostructure thickness that remained after deposition of a reflective coating.

In the preferred embodiment lateral confinement regions of said active region that are deepened in a predetermined manner have refractive indices less than the effective refractive index $n_{eff}$ of the heterostructure. In this case said emission confinement regions are placed at a predetermined distance (of micron sizes) from the lateral sides of the active region and at a predetermined depth below the disposition of the active layer of the heterostructure, in extreme cases up to a confining layer of the heterostructure nearest to the substrate. This makes it possible to improve the stability of mode generation and respectively to increase lasing efficiency of the IDL at increased output powers.

In the preferred embodiment on the side of emission output at least one active region, at least its part, is made to widen at a corresponding angle, and on the side opposite to the side of emission output in said widening active region the initial part of its length is made with a width equal to the width of the previous active region. Then for said widening active region the reflector on the side of emission output has a width approximately equal to the width of the initial part of the widening active region.

In the preferred embodiment at least two active regions of the integrated diode laser have independent ohmic contacts.

The essence of the unobvious IDL proposed in the present invention consists in the unobvious and efficient integral connection between diode lasers, the construction of their optical resonators and the method of laser emission output outside the optical resonator. The singularity of the optical resonator construction is that both its reflectors practically totally reflect emission emerging from the active layer of the laser, and laser emission output is realized mainly from the leak-in layer of the proposed heterostructure, omitting the nontransmitting reflectors of the optical resonator through a practically fully antireflection optical facet (less than 0.01%).

The technological realization of the IDL proposed in the present invention is based on known basic technological processes that are by now well developed and widely used. The proposal meets the criterion "industrial applicability". The main distinction in its manufacturing consists in the features of the heterostructure and the optical resonators of the diode lasers.

Another aspect of the present invention is an integrated semiconductor optical amplifier (hereinafter referred to as the ISOA) including a master diode laser (MDL) and a semiconductor amplifying element (SAE) integrally connected, placed along the same axis and made of the same semiconductor heterostructure. Said heterostructure contains at least one active layer, at least two confining layers, a region transparent for emission. Said ISOA includes also optical facets, ohmic contacts. Besides, the MDL includes an active region with current flowing in operation of the master diode laser, emission confinement regions from the lateral sides of said active region, an optical resonator and its reflectors, and the SAE includes at least one amplification region (with current flowing in operation of the SAE) with an antireflection coating on the output optical facet. Said heterostructure is additionally characterized by the ratio of the effective refractive index $n_{eff}$ of the heterostructure to the refractive index $n_{IN}$ of the leak-in layer, namely, the ratio of $n_{eff}$ to $n_{IN}$ is determined from the range from one plus delta to one minus gamma, where delta and gamma are determined by a number much lesser than one and gamma is more than delta. Said region transparent for emission and being a leak-in region has at least a leak-in layer. Said leak-in region is placed between the active layer and a corresponding confining layer, at least on one side of the active layer. Besides, there are MDL emission confinement regions that are located at a predetermined distance from both lateral sides of the active region with flowing current and penetrate from the external layer into the heterostructure at least to the active layer and further deep into the heterostructure. The optical resonator of the MDL is confined by reflectors with a laser emission reflection coefficient near one. In this case the MDL reflector contiguous with the active amplification region of the SAE is made adjacent to the active layer and to semiconductor layers of the heterostructure located on both sides of the active layer, the total thickness of said semiconductor layers is at least in the range from $(\lambda/4n_{\mathit{eff}})$ µm to $(4\lambda/n_{\mathit{eff}})$ µm, where $\lambda$ is the free-space laser wavelength, and the antireflection coating on the output optical facet of the SAE is made with a reflection coefficient near zero.

The essential distinction of the new proposed ISOA consists in the unobvious integral connection of the MDL and the SAE and an unusual optical resonator of the MDL. A lasing threshold of the MDL is attained in an optical resonator, both reflectors of which have maximum high reflection coefficients.

The integral connection between the MDL and the SAE is carried out without focusing optics and practically without emission loss through the wide-band leak-in region of the proposed MDL and SAE heterostructure. The output of emission from the ISOA is carried out through the leak-in region of the new proposed heterostructure with an antireflection (less than 0.01%) output optical facet of the SAE. It is this proposal that has opened up new possibilities to achieve the above technical result for the ISOA.

In the preferred embodiment on the side opposite to the side of emission output the optical resonator reflector with a laser emission reflection coefficient near one has a height equal to the heterostructure thickness.

In the preferred embodiment an antireflection coating is on an optical facet either throughout the heterostructure thickness or on part of the heterostructure thickness that remained after deposition of a reflective coating.

In the preferred embodiment lateral confinement regions of said active region of the MDL that are deepened in a predetermined manner have refractive indices less than the effective refractive index $n_{\mathit{eff}}$ of the heterostructure. In this case said confinement regions are placed at a predetermined distance (of micron sizes) from the lateral sides of the active region and at a predetermined depth below the disposition of the active layer of the heterostructure, in extreme cases up to a confining layer of the heterostructure nearest to the substrate. This makes it possible to improve the stability of mode generation and respectively to increase lasing efficiency of the ISOA at increased output powers.

In the preferred embodiment on the side of emission output at least one amplification region of the SAE, at least its part, is made to widen at a corresponding angle, and on the side opposite to the side of emission output in said widening amplification region the initial part of its length is made with a width approximately equal to the width of the previous active region of the MDL.

In the preferred embodiment the active region of the MDL and the amplification region of the SAE have independent ohmic contacts.

The essence of the unobvious ISOA proposed in the present invention consists in the unobvious and efficient integral connection between the MDL and the SAE.

The singularity of the optical resonator of the MDL is that both its reflectors practically totally reflect emission emerging from the active layer of the laser.

The output of laser emission from the MDL to the SAE is realized mainly from the leak-in layer of the new proposed heterostructure, omitting the nontransmitting reflectors of the optical resonator. The amplified emission is output through the practically fully antireflection optical output facet of the SAE, said facet being adjacent to the wide-band semiconductor layers of the heterostructure.

The technological realization of the ISOA proposed in the present invention is based on known basic technological processes that are by now well developed and widely used. The proposal meets the criterion "industrial applicability". The main distinction in its manufacturing consists in the features of the heterostructure and the optical resonator of the MDL.

BRIEF DESCRIPTION OF THE DRAWINGS

The present invention will be described in detail below in connection with FIGS. 1 . . . 8, where.

DETAILED DESCRIPTION OF PREFERRED EMBODIMENTS

Figure 1:
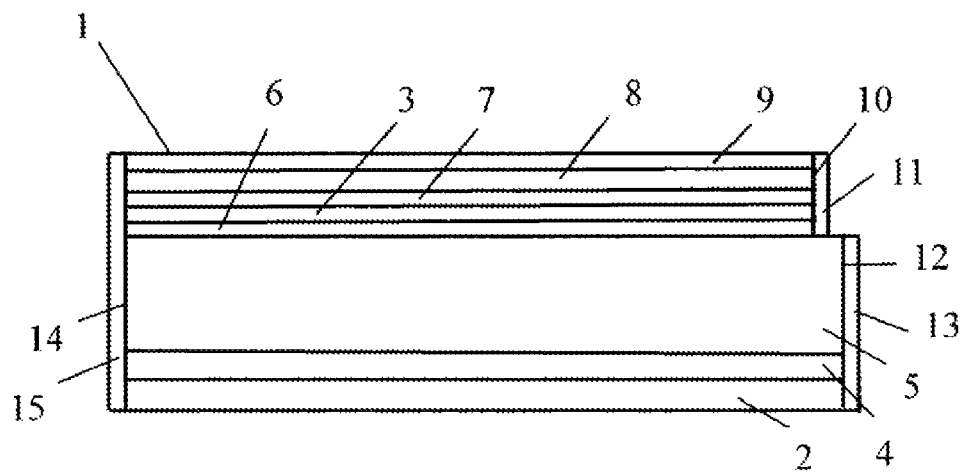
FIG. 1 is a schematic illustration of the longitudinal section of the proposed diode laser with nontransmitting reflectors of the optical resonator and laser emission output from the leak-in layer of the heterostructure through an optical facet with an antireflection coating.

Hereinafter the invention is explained by the description of concrete embodiments with references to the enclosed drawings. The given examples of the embodiments of the diode laser, the integrated diode laser, and the integrated semiconductor optical amplifier are not the only ones and assume the availability of other realizations, including the known wavelength ranges, the features of which are reflected in the sum of the distinctions according to the claim.

The proposed diode laser 1 with the nontransmitting optical resonator (NOR-DL) (see FIGS. 1-2) contains on the substrate 2 of the n-type GaAs a laser heterostructure based on InAlGaAs compounds with one active layer 3 of InGaAs. The length of the optical resonator is 4 mm. Between the active layer 3 and the confining layer 4 (on the side of the substrate) a leak-in region containing the leak-in layer 5 and the adjusting layer 6 is placed. On the opposite side to the active layer 3 the adjusting layer 7 is adjacent, to which the confining layer 8 is adjacent. Then to the confining layer 8 the semiconductor contact layer 9 is adjacent. Metallization layers are not shown in the figures. In fact, the set of all heterostructure layers located between the confining layers 4 and 8 forms a waveguide region of the DL with an unusually large thickness that is determined by the thickness of the leak-in layer 5. Characteristic is the fact that the thickness of the leak-in layer 5 can have sizes approximately from 2 μm to 10 μm and more, and the thicknesses of the adjusting layers 6 and 7 can be approximately from 0.1 μm to 1.0 μm. The value of the ratio of the effective refractive index $n_{eff}$ of the heterostructure to the refractive index $n_{IN}$ of the leak-in layer is determining. The calculated $n_{eff}/n_{IN}$ at current densities of 0.1 kA/cm$^2$ and 10 kA/cm$^2$ were respectively 1.000001 and 0.999854. The laser wavelength was chosen equal to 0.976 μm and was determined by the composition and thickness of the active layer 3. The reflector of the optical resonator of the Laser 1 located on the side of emission output was made by etching a corresponding notch on the external surface of the heterostructure. On the optical facet 10 of height about 2 μm produced in the notch (said optical facet being adjacent to the heterostructure layers 6, 3, 7, 8, and 9) the reflective coatings 11 with a reflection coefficient $R_1$ of 99% were deposited. For laser emission output, on the cleaved optical facet 12 the antireflection coating 13 with a reflection coefficient $R_2$ less than 0.01% was deposited. On the side opposite to the side of emission output throughout the cleaved optical facet 14 the reflective coatings 15 with a reflection coefficient $R_1$ of 99% were deposited. The active regions 16 with flowing current are made as stripe regions with a stripe width of 100 μm. The lateral optical confinement of laser emission in the active region 16 with flowing current is realized by the confinement regions 17 made as stripe grooves filled with a dielectric and placed at a distance of 3 μm from the lateral sides of the active region 16 with flowing current. Let us note that the bottom of the dielectric confinement regions 17 is located below the active layer 3 of the heterostructure. For a chosen thickness of the leak-in layer 5 of 8.0 μm the threshold current density of this NOR-DL embodiment was 120 A/cm$^2$, the multimode laser emission power was 15 W, the differential efficiency was 85%. The angle of divergence in the vertical plane was 7.0°, in the horizontal −4.0°.

Figure 3:
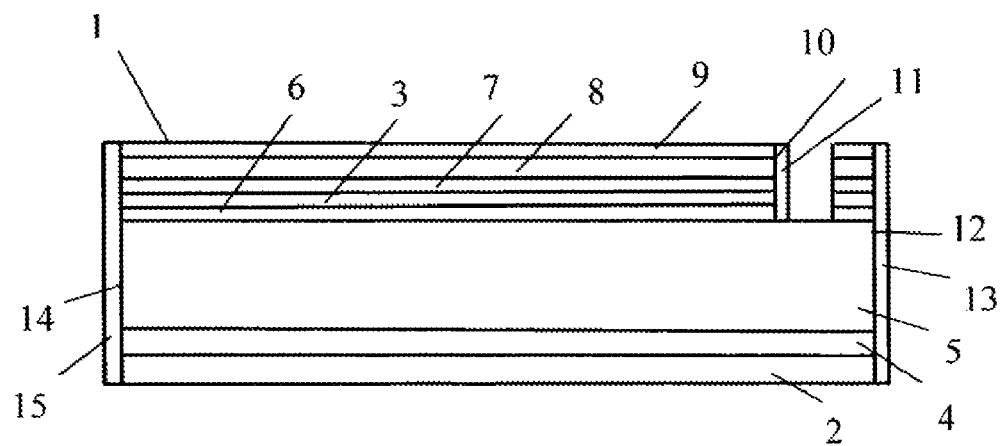
FIG. 3 is a schematic illustration of the longitudinal section of the proposed diode laser with nontransmitting reflectors of the optical resonator differing from the diode laser schematically represented in FIG. 1 in that the output facet with an antireflection coating is placed from the external surface of the heterostructure to the heterostructure base.

The following embodiment of the diode laser 1 (NOR-DL) (see FIG. 3) differed from the previous one in that in this embodiment for laser emission output the cleaved facet 12 with the deposited antireflection coating 13 was placed outside the notch to a distance of 25 μm. The parameters of this NOR-DL embodiment were similar to the parameters of the previous embodiment.

Figure 2:
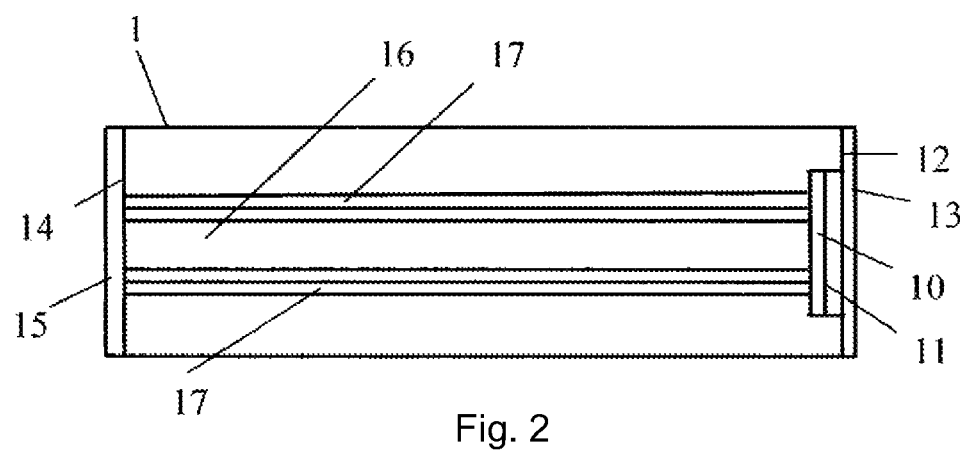
FIG. 2 is a schematic illustration of the top view of the proposed diode laser with nontransmitting reflectors of the optical resonator, the longitudinal section of which is schematically represented in FIG. 1.

It should be noted that an embodiment of the diode laser 1 is possible, in which, in distinction to the embodiment presented in FIGS. 1-2, the lateral optical confinement of laser emission in the active region 16 is realized by the confinement regions 17, the bottom of which is located above the active layer 3 of the heterostructure, for example, by 0.2 μm. The maximum output power of this embodiment does not exceed 5 W.

Figure 4:
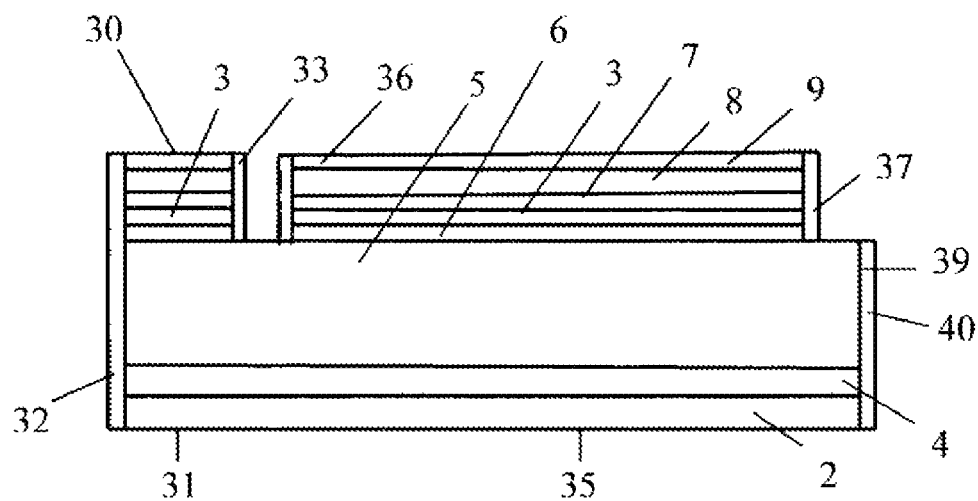
FIG. 4 is a schematic illustration of the longitudinal section of the proposed integrated diode laser in the form of two lasers integrally connected along the axis, in said integrated diode laser two optical resonators are placed serially along the axis, the reflectors of said optical resonators have a high reflection coefficient and contain two active regions with flowing current.
Figure 5:
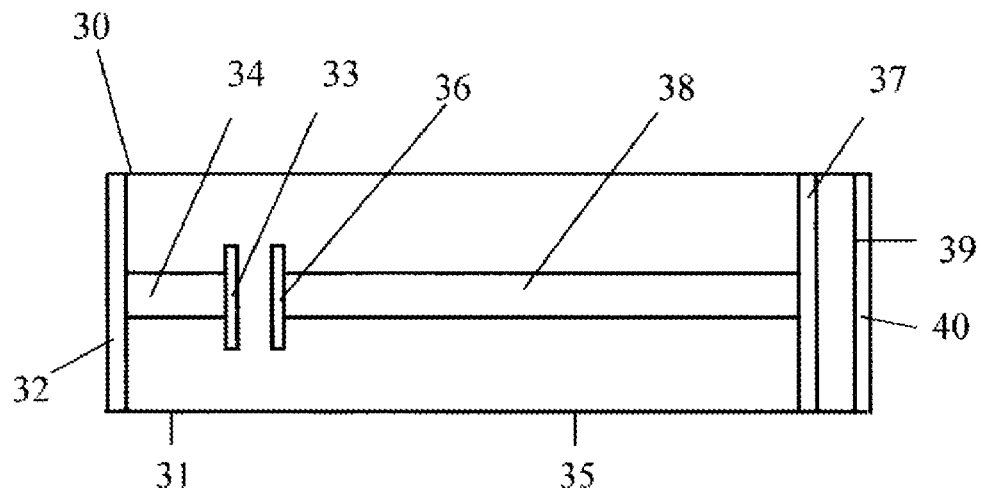
FIG. 5 is a schematic illustration of the top view of the integrated diode laser, the longitudinal section of which is schematically represented in FIG. 4.

The proposed integrally connected IDL 30 (see FIGS. 4-5) contains along the optical axis of laser emission propagation two integrally connected diode lasers based on the same heterostructure as the NOR-DL. The first diode laser 31 includes the optical resonator of length 1.0 mm with the nontransmitting reflectors 32 and 33 and the stripe active region 34 of width 100 μm, the second diode laser 35 includes the optical resonator of length 5.0 mm with the nontransmitting reflectors 36 and 37 and the stripe active region 38 of width 100 μm. Laser emission output is carried out through the antireflection facet 39 with the dielectric coating 40. The threshold current density of this IDL embodiment was 90 A/cm$^2$, the laser output power increased to 25 W, the differential efficiency and the angles of divergence were the same as in the previous embodiments.

The following embodiment of the IDL 30 differed from the previous one in that this embodiment was made as a lattice of (twenty) IDL 30 located in parallel. The output power of such a lattice is 500 W.

The following embodiment of the IDL 30 (see FIG. 6) differed from the previous one in that in this embodiment the width of the active region 34 of the first diode laser 31 was 10 μm, and the configuration of the active region of the second diode (output) laser 35 consisted of two parts. The width of the active region (1.0 μm in length) in its first part 41 was 10 μm, and the second part 42 of the active region (4.0 μm in length) was made to widen with an angle of widening of 7° which results in a width of the output laser emission aperture of 490 μm. This embodiment generates single-mode laser emission of 5 W power with the following diffraction angles of divergence: in the vertical plane 8°, in the horizontal plane 0.20°. The differential efficiency of laser emission is within 75 . . . 90%.

Figure 6:
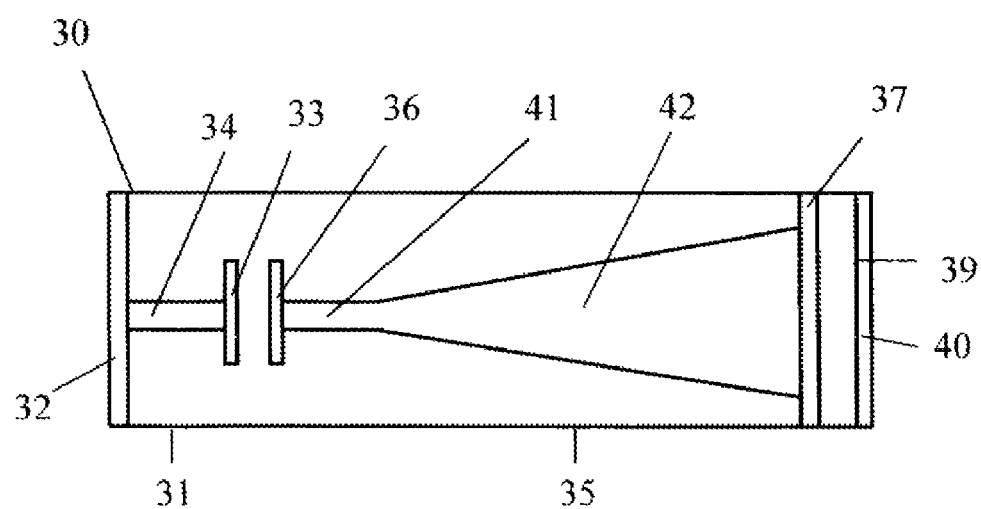
FIG. 6 is a schematic illustration of the top view of the integrated diode laser, the longitudinal section of which is schematically represented in FIG. 4, in said integrated diode laser part of the active region adjacent to the output optical facet with an antireflection coating is made to widen.

The following embodiment of the IDL 30 differed from the embodiment presented in FIG. 6 in that this embodiment was made as a lattice of (twenty) IDL 30 located in parallel with an output power of 100 W.

Figure 7:
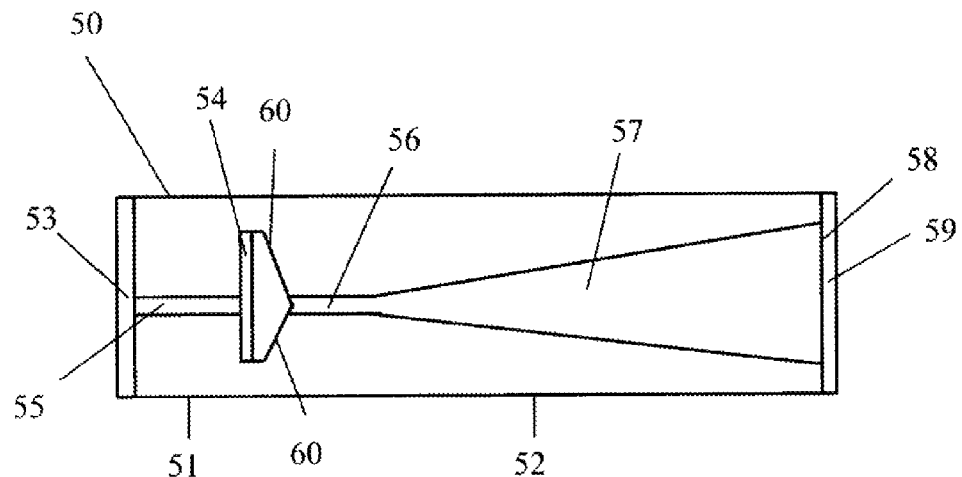
FIG. 7 is a schematic illustration of the top view of the proposed ISOA including the MDL and the SAE, in said ISOA part of the amplification region of the SAE neighboring the master diode laser has a width approximately equal to the width of the stripe active region of the master laser, and part of the amplification region of the SAE adjacent to the output optical facet with an antireflection coating is made to widen.

The proposed integrally connected ISOA 50 (see FIG. 7) contains along the optical axis of laser emission propagation, integrally connected, the master diode laser 51 (MDL) with a length of the optical resonator of 1.0 mm and the semiconductor amplifying element 52 (SAE) with a length of the amplification region of 5.0 mm. The MDL 51 includes the optical resonator of length 1.0 mm with the nontransmitting reflectors 53 and 54 and the stripe active region 55 of width 10 μm. The SAE includes two parts of the amplification region, 56 and 57. The first part 56 of the amplification region is made with the same length and width as the active region 55 in the MDL 51. The second part 57 of the amplification region of length 5.0 mm is made to widen with an angle of widening of 7° which results in a width of the output laser emission aperture about 600 μm. On the output optical facet 58 of the amplification region the antireflection dielectric coating 59 with a reflection coefficient less than 0.01% is deposited. The profile of the notch 60 at the boundary with the first part 56 of the amplification region plays the role of a stabilizing element. The given ISOA makes it possible to obtain single-mode laser emission of a power up to 10 W with high quality of emission. The diffraction angle of emission divergence is 8° in the vertical plane and 0.14° in the horizontal plane. The differential efficiency of laser emission is within 80 . . . 90%.

The following embodiment of the ISOA 50 (see FIG. 8) differed from the previous one in that in this embodiment in opposite directions along the axis to one MDL 51 on each side one SAE 52 was integrally connected. This ISOA emits in two opposite directions with parameters of emission similar to the parameters of the previous embodiment.

Figure 8:
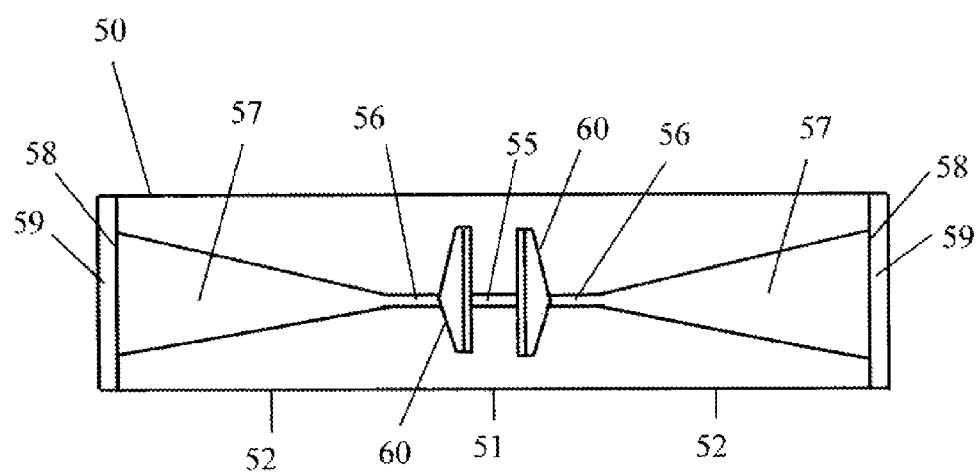
FIG. 8 is a schematic illustration of the top view of the proposed ISOA that differs from the ISOA schematically represented in FIG. 7 in that the master diode laser is integrally connected with two SAE along the axis in two opposite directions.

The following embodiment of the ISOA 50 differed from the embodiment presented in FIG. 8 in that this embodiment was made as a lattice of (seventeen) ISOA 50 located in parallel with a total output power of 340 W.

INDUSTRIAL APPLICABILITY

Semiconductor sources of laser emission: diode lasers (DL) as well as integrated diode lasers (IDL) and integrated semiconductor optical amplifiers (ISOA) are used in fiberoptic communication and data transmission systems, in optical superhigh-speed computing and switching systems, in development of laser industrial equipment, medical equipment, for realization of frequency-doubled lasers, and for pumping solid-state and fiber lasers and amplifiers.

The invention claimed is:

1. A diode laser comprising a heterostructure based on semiconductor compounds, said heterostructure containing at least one active layer, at least two confining layers, an emission leak-in region, said leak-in region being transparent for emission, said leak-in region containing at least a leak-in layer placed disposed between the active layer and a corresponding confining layer, at least on one side of the active layer, said diode laser further comprising an active region operable to conduct current during operation of the diode laser, optical facets, reflectors, an optical resonator, an ohmic contact, wherein in said heterostructure the ratio of the effective refractive index $n_{eff}$ of the heterostructure to the refractive index $n_{IN}$ of the leak-in layer (the ratio of $n_{eff}$ to $n_{IN}$) is determined from a range between one plus delta and one minus gamma, wherein delta and gamma being determined by a number much lesser than one and gamma being more than delta, and wherein at a predetermined distance from both lateral sides of the active region with flowing current emission confinement regions being located and penetrating from the external layer into the heterostructure at least to the active layer and further deep into the heterostructure, on the side of emission output on an optical facet there is provided an antireflection coating with a laser emission reflection coefficient near zero, and on the same side of emission output an optical resonator reflector with a laser emission reflection coefficient near one being formed, said reflector being adjacent to the active layer and to semiconductor layers of the heterostructure located on both sides of the active layer, the total thickness of said semiconductor layers being at least in the range from $(\lambda/4n_{eff})$ μm to $(4\lambda/n_{eff})$ μm, wherein λ is the free-space laser wavelength.

2. The diode laser of claim 1 wherein delta is near zero.

3. The diode laser of claim 1 wherein the reflector formed at the side of the emission output extends from the external layer of the heterostructure to approximately the leak-in layer of the leak-in region located on the side of the substrate.

4. The diode laser of claim 1 further comprising an antireflection coating disposed on the side of emission output, wherein the antireflection coating is disposed on an optical facet either throughout the heterostructure thickness or on part of the heterostructure thickness that remained exposed after deposition of a reflective coating.

5. The diode laser of claim 1 wherein on the side opposite to the side of emission output the height of the optical resonator reflector having a laser emission reflection coefficient near one is equal to the heterostructure thickness.

6. The diode laser of claim 1 wherein said emission confinement regions are disposed at a predetermined distance from the lateral sides of the active region with flowing current, and the refractive indices of the confinement regions are chosen to be less than the effective refractive index $n_{eff}$ of the heterostructure.

7. The diode laser of claim 1 wherein said confinement regions extend up to the confining layer of the heterostructure on the side of the substrate.

8. An integrated diode laser comprising a heterostructure based on semiconductor compounds, said heterostructure containing at least one active layer, at least two confining layers, an emission leak-in region, said leak-in region being transparent for emission, said leak-in region containing at least a leak-in layer disposed between the active layer and a corresponding confining layer, at least on one side of the active layer, said integrated diode laser further comprising at least two optical resonators and at least two active regions operable to conduct current during operation of the integrated diode laser located along the same axis, optical facets, reflectors, and an ohmic contact, wherein in said heterostructure the ratio of the effective refractive index $n_{eff}$ of the heterostructure to the refractive index $n_{In}$ of the leak-in layer (the ratio of $n_{eff}$ to $n_{IN}$) is determined from the range between one plus delta and one minus gamma, wherein delta and gamma being determined by a number much lesser than one and gamma being more than delta, and wherein at a predetermined distance from both lateral sides of the active region with flowing current emission confinement regions being located and penetrating from the external layer into the heterostructure at least to the active layer and further deep into the heterostructure, on the side of emission output on an optical facet there is an antireflection coating with a laser emission reflection coefficient near zero, each optical resonator being confined by reflectors having laser emission reflection coefficients near one and being adjacent to the active layer and to semiconductor layers of the heterostructure located on both sides of the active layer, the total thickness of said semiconductor layers being at least in the range from $(\lambda/4n_{eff})$ μm to $(4\lambda/n_{eff})$ μm, where λ is the free-space laser wavelength.

9. The integrated diode laser of claim 8 wherein on the side of emission output at least one active region conducting current, at least in part, is made to widen at a corresponding angle.

10. The integrated diode laser of claim 9 wherein the initial part of the length of the widening active region that is disposed on the side opposite to the side of emission output has a width equal to the width of the previous active region in the previous diode laser.

11. The integrated diode laser of claim 9 wherein for the widening active region conducting current, the reflector with a high laser emission reflection coefficient has a width approximately equal to the width of the initial part of the widening active region.

12. The integrated diode laser of claim 8 wherein at least two active regions of the integrated diode laser comprise independent ohmic contacts.

13. An integrated semiconductor optical amplifier comprising a master diode laser and a semiconductor amplifying element integrally connected, placed along the same axis and made of the same semiconductor heterostructure, said heterostructure containing at least one active layer, at least two confining layers, a region transparent for emission as well as said integrated semiconductor optical amplifier comprising optical facets, ohmic contacts, wherein the master diode laser comprising an active region operable to conduct current during operation of the master diode laser, emission confinement regions from both lateral sides of said active region, an optical resonator and its reflectors, and the semiconductor amplifying element comprising at least one amplification region (with current flowing in operation of the semiconductor amplifying element) with an antireflection coating on an output optical facet, wherein in said heterostructure the ratio of the effective refractive index $n_{eff}$ of the heterostructure to the refractive index $n_{IN}$ of a leak-in layer (the ratio of $n_{eff}$ to $n_{IN}$) is determined from the range between one plus delta and one minus gamma, where delta and gamma being determined by a number much lesser than one and gamma being more than delta, the region transparent for emission and being a leak-in region having at least the leak-in layer and being placed between the active layer and a corresponding confining layer, at least on one side of the active layer, and wherein at a predetermined distance from both lateral sides of the active region with flowing current of the master diode laser emission confinement regions being located and penetrating from the external layer into the heterostructure at least to the active layer and further deep into the heterostructure, said optical resonator being confined by reflectors with a laser emission reflection coefficient near one, the master diode laser reflector contiguous with the active amplification region of the semiconductor amplifying element being made adjacent to the active layer and to semiconductor layers of the heterostructure located on both sides of the active layer, the total thickness of said semiconductor layers being at least in the range from $(\lambda/4n_{eff})$ μm to $(4\lambda/n_{eff})$ μm, where $\lambda$ is the free-space laser wavelength, and the antireflection coating on the output optical facet of the semiconductor amplifying element being made with a reflection coefficient near zero.

14. The integrated semiconductor optical amplifier of claim 13 wherein at least one amplification region with flowing current is made to widen at a corresponding angle.

15. The integrated semiconductor optical amplifier of claim 14 wherein the initial part of the length of the widening amplification region with flowing current has a width close to the width of the previous active region of the master diode laser.

16. The integrated semiconductor optical amplifier of claim 13 wherein said active region and said amplification region comprise independent ohmic contacts.

* * * * *